United States Patent

Araki et al.

[11] Patent Number: 5,187,413
[45] Date of Patent: Feb. 16, 1993

[54] LOW PRESSURE DISCHARGE LAMP APPARATUS

[75] Inventors: Kenji Araki, Yokosuka; Hiroki Sasaki, Yokohama; Akihiro Yonezawa, Yokosuka; Youichirou Mitsuyuki, Tokyo, all of Japan

[73] Assignee: Toshiba Lighting & Technology Corporation, Tokyo, Japan

[21] Appl. No.: 753,066

[22] Filed: Aug. 30, 1991

[30] Foreign Application Priority Data

Aug. 31, 1990 [JP] Japan ................... 2-228468

[51] Int. Cl.5 ............ H05B 37/02; H05B 41/36
[52] U.S. Cl. .................... 315/291; 315/208; 315/209 R; 315/224
[58] Field of Search ............ 315/291, 246, 205, 208, 315/209 R, DIG. 7, 224

[56] References Cited

U.S. PATENT DOCUMENTS

| | | | |
|---|---|---|---|
| 3,679,928 | 7/1972 | Johnson | 313/225 |
| 3,789,266 | 1/1974 | Polman et al. | 315/194 |
| 4,001,633 | 1/1977 | van Tongeren et al. | 351/117 X |
| 4,112,331 | 9/1978 | Verbeek et al. | 315/125 |
| 4,260,932 | 4/1981 | Johnson | 315/DIG. 5 |

FOREIGN PATENT DOCUMENTS 0131965 1/1985 European Pat. Off. .
0239374 9/1987 European Pat. Off. .

Primary Examiner—Eugene R. LaRoche
Assistant Examiner—Son Dinh
Attorney, Agent, or Firm—Cushman, Darby & Cushman

[57] ABSTRACT

A low pressure discharge lamp apparatus has a low pressure discharge lamp with an arc tube. The arc tube has a first end and a second end, each with electrodes which define a discharge space therebetween. A mercury/rare gas is sealed in the arc tube. The low pressure discharge lamp apparatus further has a lighting circuit apparatus for lighting the lamp by supplying a current with a polarity reversed for each half cycle to electrodes in the first and second ends of the arc tube. The lighting circuit apparatus supplies, to the lamp, a current whose waveform has a flat peak for each half cycle and a maximum current value of the current is restricted to less than a level in which the excitation of mercury atoms is saturated.

7 Claims, 4 Drawing Sheets

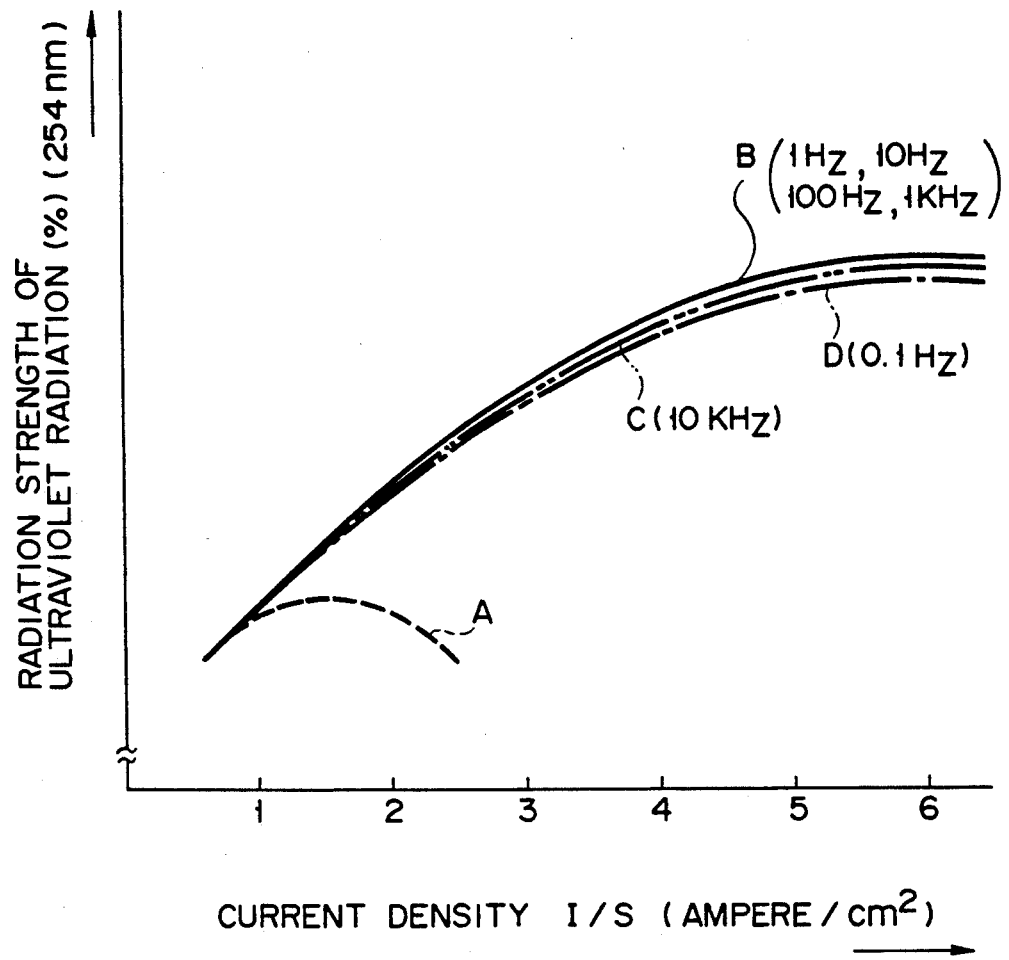
F I G. 4

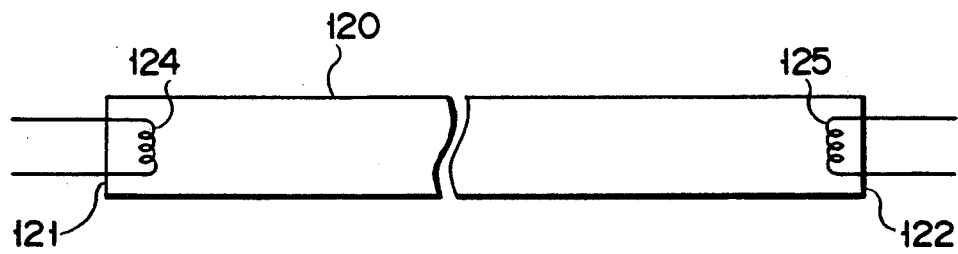
F I G. 5
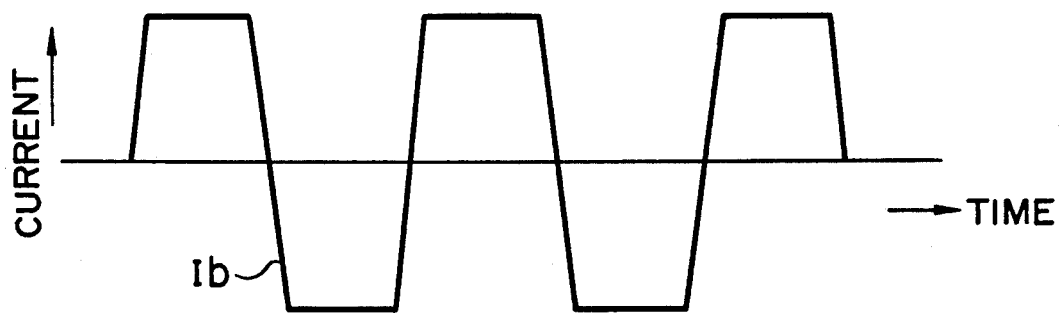
F I G. 6

LOW PRESSURE DISCHARGE LAMP APPARATUS

BACKGROUND OF THE INVENTION

1. Field of the Invention

The present invention relates to a low pressure discharge lamp apparatus and in particular, a lamp apparatus effective as an ultraviolet light source for produced by a photochemical reaction.

2. Description of the Related Art

The technique for producing a photochemical reaction emitting of ultraviolet radiation found its application in the various fields of the art. In the semiconductor manufacturing technique, various methods have been extensively used, such as a photochemical vapor deposition method for use in the growth of a thin silicon film on a semiconductor substrate, ultraviolet radiation for use in the polymerization and curing of a photo-resist, photoashing using ultraviolet radiation, and washing using light.

Even in those fields, such as the purification of water, sterilization treatment, and pasteurization treatment of meat and flesh, the technique for performing various treatments using ultraviolet radiation of a short wavelength for illumination has been rapidly developed.

In these respective fields, there is a growing demand for those light sources for emitting ultraviolet radiation of a short wavelength for effective illumination. A low pressure mercury discharge lamp is employed for that purpose.

The low pressure mercury discharge lamp has a discharge tube of quartz glass transmissive to ultraviolet radiation and a pair of electrodesone at each end. A mercury/rare gas is sealed in the discharge tube and, when discharge occurs at the mercury vapor in low pressure, ultraviolet radiation of a short wavelength of 185 nm and 254 nm, a resonant line of the mercury, is emitted.

In recent times, improved treating capability and treating speed have been demanded in the field using the aforementioned photochemical reaction technique. To meet these requirements, it is necessary to increase the intensity of ultraviolet radiation emitted from the lamp.

A high power output or a very high power output lamp is desired through an increase in a light output per unit length or per unit area of the lamp.

The discharge lamp has, in general, a property that an increase in the input of the lamp results in an increase in the light output. With I (ampere) and S ($cm^2$) representing current supplied to the lamp and a cross-sectional area of the discharge space, respectively, an increase in the current density leads to an increase in an amount of emission of ultraviolet radiation.

In the conventional lamp, however, an increase in the density of current causes an increase in the output of the ultraviolet radiation for some level range and no increase in the output of the ultraviolet radiation, for a range greater than a given level. There is also a tendency that an increase in the lamp input leads to a drop in the output of the ultraviolet radiation, a phenomenon where the amount of emission of the ultraviolet radiation is saturated, even though the mercury vapour pressure is controlled to stay constant.

The reason for this is assumed to be as follows:

The conventional low pressure mercury discharge lamp has been employed such that it is connected to a lighting circuit apparatus using a reactor element such as a choke coil's ballast. The lighting circuit apparatus using a reactor element employs a commercial power supply voltage in a boosted or reduced level. Therefore, a sinusoidal waveform current is supplied from the lighting circuit to the lamp.

The sinusoidal waveform current has a low current area in which it never reaches an effective current value (root mean never square value), effective to ionize when positive and negative polarities are reversed. As a result, the density of the ionized mercury is lowered, and mercury atoms are less excited. Hence, the excited mercury density is lowered.

The light emission of the mercury occurs due to the impact of electrons against mercury atoms. The lowering of the aforementioned electron density corresponded to the decrease of excited mercury atoms and of the excited mercury density. This lowers the light output and hinders the output of the ultraviolet radiation.

Even if a lamp supply current is increased above a given level, a lowering in the mercury density and a drop in the ratio of the electron temperature are rather great, a state that the output of the ultraviolet radiation is saturated.

For the electric current of the sinusoidal waveform, a peak current flows in the lamps discharge path at a level about $\sqrt{2}$ times the effective value (root means square value) effective to the ionization. The $\sqrt{2}$ times peak current excessively ionizes the mercury atoms in the arc and the amount of excited mercury atoms is removed in the ionization, lowering an amount of excited mercury atoms. The emission of the ultraviolet radiation occurs when the excited mercury atoms return back to a steady-state. As the amount of excited mercury conducive to the aforementioned light emission becomes smaller, the amount of emission of the ultraviolet radiation is lowered. Further, an increase in the peak current leads to a drop in the electron temperature, making the excitation of mercury atoms more and more difficult.

In order to replenish the amount of excited mercury atoms it is necessary to accelerate the evaporation of mercury and to heighten the mercury vapor pressure. However, the mercury vapor pressure has an optimum range in which the luminous efficiency becomes maximal. Therefore, when out of this optimum range, the mercury vapor pressure becomes too high, the emitted ultraviolet radiation is absorbed in a high-density mercury vapor in the arc, and the ultraviolet radiation is lowered due to the "self-absorption".

Since, in the conventional case, a sinusoidal current flows in the lamp, even if the current density of the lamp is improved, it is not possible it is reached to, once it is reached to a maximum level is reached, to heighten the intensity of the ultraviolet radiation beyond the maximum level. Thus, the maximum output level of the ultraviolet radiation is low.

SUMMARY OF THE INVENTION

It is accordingly the object of the present invention to provide a low-pressure discharge lamp apparatus which can light a low pressure discharge lamp at a high current density and increase light output.

According to the present invention, there is provided a low pressure discharge lamp apparatus comprising: a low pressure discharge lamp comprised of a discharge tube including a first end and a second end and having electrodes respectively, and defining a discharge space across these electrodes and a mercury/rare gas sealed in the discharge tube; a lighting circuit means for lightning the lamp by supplying a current to the electrode with a polarity reversed for each half cycle; wherein the lighting circuit means supplies, to the lamp, a current whose peak has a flat waveform for each half cycle and a maximum current value of the current of the flat-peak waveform is restricted to less than a level in which the excitation of mercury atoms is saturated.

The inventors have found that the output of the ultraviolet radiation is improved by making the waveform of a current in the lamp's discharge path a flat peak waveform at half cycle and increasing the current.

This is probably caused by the following.

In the conventional case, since a current of a sinusoidal waveform is supplied to the lamp's discharge path, a low current area which does not reach current value effective to ionization is created when the positive and negative polarities are reversed. Thus, lowering a density of mercury ionized during a low current period, and lowering the density of excited mercury. Even if the current supplied to the lamp is increased above a given level, a lowering ratio in the density of the mercury rather becomes larger and the output of the ultraviolet radiation is not improved.

On the other hand, if a current of a flat peak waveform, such as a rectangular or trapezoid current, is supplied to the lamp's discharge path, no low current area is created when the positive and negative polarities are reversed. Thus, there exits no excessive current region exerting any harmful effect on the emission of light, failing to lower the density of the ionized mercury, the density of the excited mercury and the electron temperature resulting from a lowering in peak current. This eliminates a cause for suppressing the output of the ultraviolet radiation and it is possible to convert most of energy which is supplied to the lamp to one effective to the output of the ultraviolet radiation.

From this it is presumed that the density of current is increased and hence the light output is improved.

The present invention has been experimentally confirmed. Due to the effect as set out above, the maximum current value can be increased up to a level at which the excitation of mercury atoms reaches a saturation state and it is possible to increase the light output in accordance with the current value.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a graph showing the relationship between the current density and the radiation strength of an ultraviolet radiation;

FIG. 5 is a representation of the low-pressure mercury discharge lamp showing the second embodiment of the present invention; and FIG. 6 is a representation showing the waveform of the trapezoidal current supplied from the lighting circuit apparatus to the lamp.

DETAILED DESCRIPTION OF THE PREFERRED EMBODIMENTS

Figure 1:
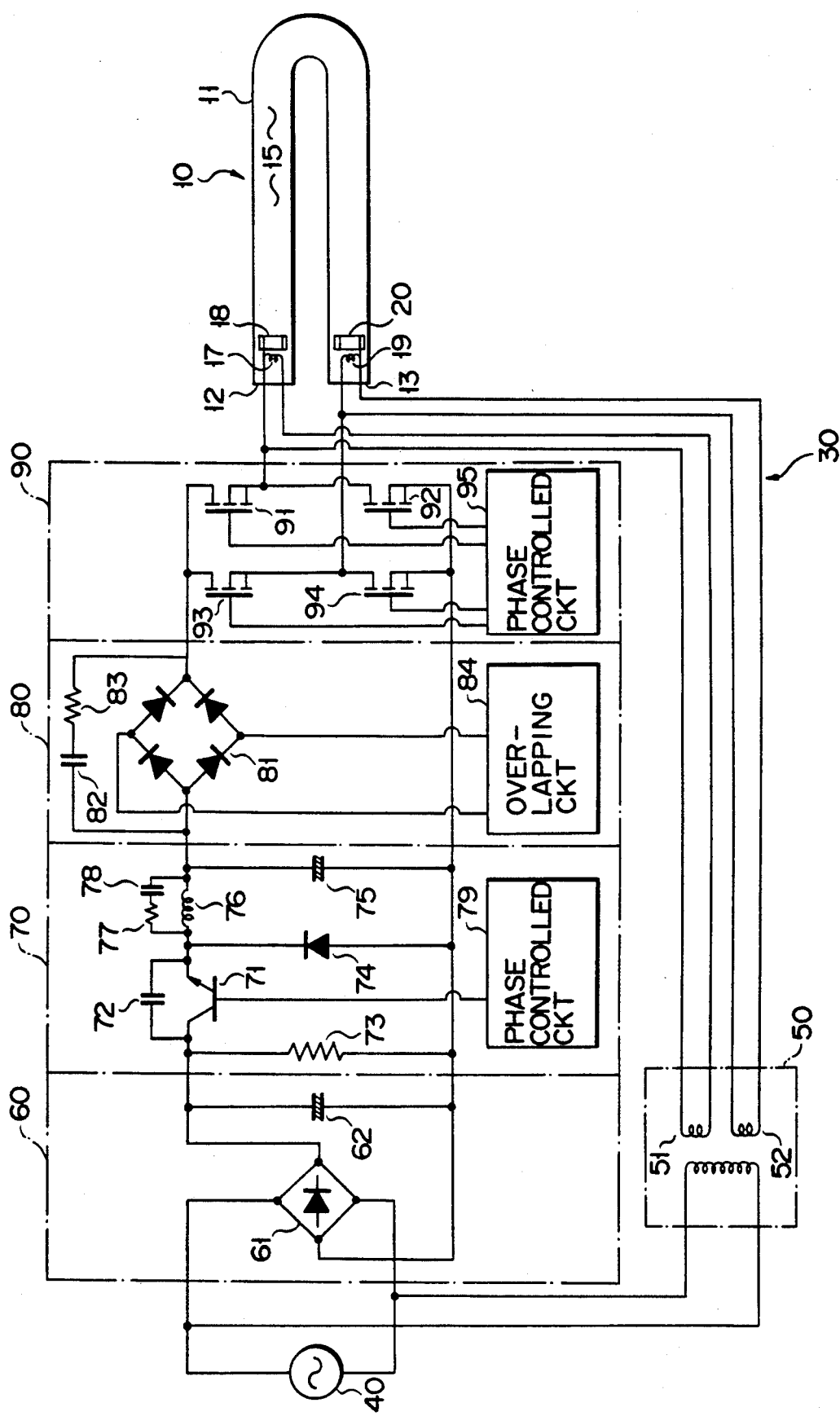
FIG. 1 is a representation showing the first embodiment of the present invention, in which the constructions of a low-pressure mercury discharge lamp and a lighting circuit apparatus are shown.
Figure 2:
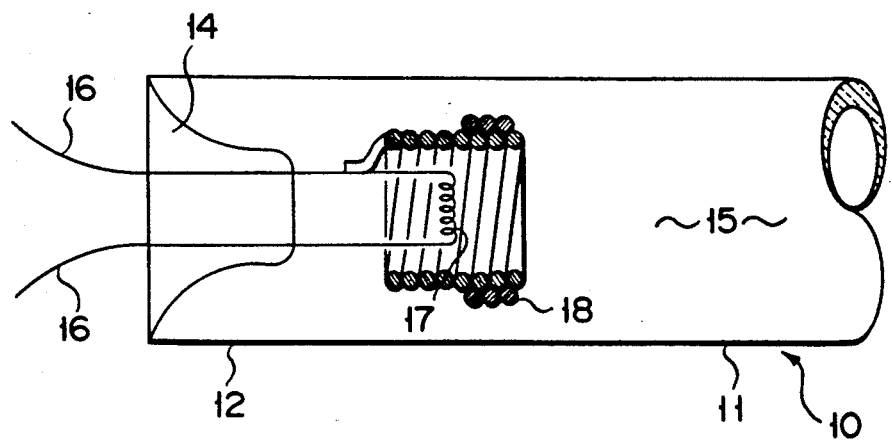
FIG. 2 is a representation showing the construction of one end of the low-pressure mercury discharge lamp.

FIG. 1 shows the construction of a low-pressure mercury discharge lamp and a lighting circuit device. FIG. 2 shows the low-pressure mercury discharge lamp. The discharge lamp 10 is provided with discharge tube 11 formed by bending a quartz glass tube having an inner diameter of, for instance, 24 mm in the "U"-shape. The discharge tube 11 has first end 12 and second end 13 which are blocked with stems 14 and 14 as shown in FIG. 2. This allows discharge space 15 to be formed in discharge tube 11.

A pair of leads 16 and 16 are sealed to each stem 14, 14, respectively, and electrodes are attached to these leads 16 and 16.

As the electrodes of this embodiment, first cathode 17 and first anode 18 are provided at first end 12 of the discharge tube 11, and second cathode 19 and second anode 20 are provided at second end 13 of discharge tube 11.

To explain the structure of these electrodes, which are represented by first end 12, first cathode 17 is bridged across the pair of leads 16 and 16 airtightly passing through stem 14 so that it is electrically and mechanically connected to the pair of leads 16 and 16, and first anode 18 is electrically and mechanically connected to one lead 16.

The cathode 17 is a hot cathode formed of a filament coil made of tungsten, and disposed so that the coil axis is orthogonal with the bulb axis.

Anode 18 is formed of a cylinder or cylindrical coil, and in this embodiment it is formed of a cylindrical coil made by closely winding a tungsten wire in the shape of a coil. The coil-shaped anode 18 is opened in the front end thereof, and the cathode 17 is received in the anode 18. Accordingly, cathode 17 is surrounded by the coil-shaped anode 18, and the cathode 17 received in the anode 18 face discharge space 15 through the front end opening of the anode 18. The front end of anode 18 is placed so as to project to discharge space 15 beyond the front of cathode 17.

In the discharge tube 11, for instance, 20 mg of mercury and 0.05 to 0.8 Torrs of argon gas are sealed.

The tube end is cooled by heat pipes or water and its temperature is maintained at 37° C., even if the gas pressure or discharge current changes.

The low-pressure mercury discharge lamp 10 is connected to a.c. power supply 40 via lighting circuit apparatus 30.

Figure 3:
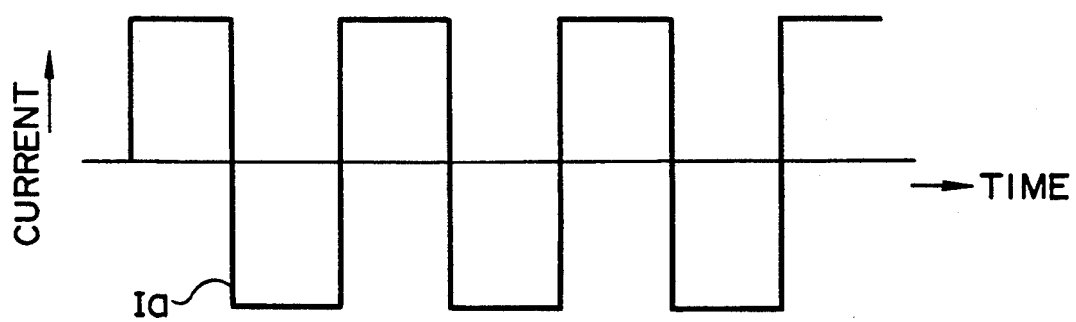
FIG. 3 is a representation showing the waveform of the rectangular-wave current supplied from the lighting circuit apparatus to the lamp.

Lighting circuit apparatus 30 includes preheat circuit 50, rectifying and smoothing circuit 60, output control circuit 70, start-up circuit 80 and switching circuit 90. Such lighting circuit apparatus 30 supplies a preheat current and a rectangular current Ia having a flat peak value as shown in FIG. 3 to discharge lamp 10.

The a.c. power supply 40 is a 50-cycle, 200 V commercial power supply. Connected to this a.c. power supply 40 are the preheat circuit 50 and rectifying and smoothing circuit 60.

Preheat circuit 50 comprises a pair of heater transformers 51 and 52, which are connected to first cathode 17 and second cathode 19, respectively. And, the heater transformers 51 and 52 cause the voltage of power supply 40 to drop and always supply a preheat current to first cathode 17 and second cathode 1 during the lighting of the lamp, and for this, these first and second cathodes 17 and 19 are to heat during the lighting of the lamp for thermionic emission.

Rectifying and smoothing circuit 60 comprises full-wave rectification diode bridge circuit 61 and smoothing capacitor 62, and rectifies the a.c. voltage of a.c. power supply 40 to a d.c. component.

Output control circuit 70 has transistor 71, capacitor 72, resistor 73, diode 74, smoothing capacitor 75, coil 76, resistor 77, capacitor 78, and phase-controlled circuit 79 connected to the gate of the transistor 71 for output control is.

The output control circuit 70 activates transistor 71 in response to the pulse supplied from the phase-controlled circuit 79 to control the output, and performs control such as the keeping the voltage supplied to lamp 10 constant.

Start-up circuit 80 includes full-wave rectification diode bridge circuit 81, capacitor 82 and resistor 83, and includes start-up voltage overlapping circuit 84 connected to the full-wave rectification diode bridge circuit 81.

The start-up circuit 80 allows a start-up voltage to be applied in overlapping relation from start-up voltage overlapping circuit 84 to the full-wave rectification diode bridge circuit 81 to start up lamp 10, whereby the start-up voltage on the order of 600 V, for instance, is supplied to lamp 10.

Incidentally, start-up voltage overlapping circuit 84 stops its operation by detecting the voltage drop across both electrodes of the lamp after the start-up of the lamp and actuates a relay, not shown.

Switching circuit 90 has four MOS field effect transistors (FET) 91, 92, 93 and 94, which constitute a full bridge configuration.

These FET's are connected to phase-controlled circuit 95 for frequency control. A pulse signal is alternately provided to each set of MOS FEDs from the phase-controlled circuit 95, thereby opening and closing the FET's of each set. When the first set of FET's 91 and 94 are turned on at a predetermined timing, a rectangular half-wave rectification current flows from first cathode 17 of lamp 10 to second anode 20 through discharge space 15, and when the second set of FET's 92 and 93 are turned on at the next predetermined timing, a rectangular half-wave rectification current flows from second cathode 19 of lamp 10 to first anode 18 through discharge space 15.

By the operation of such switching circuit 90, a rectangular cycle current Ia as shown in FIG. 3 is supplied to lamp 10. The peak current of this rectangular wave is flat. And, the maximum current is under the level at which the excitation of mercury atoms reaches a saturated state.

The low-pressure mercury discharge lamp 10 lit by such lighting circuit apparatus 30 has a rated input of 900 W for instance, and is lit so that the discharge current is 15 amperes, thereby enhancing the output.

In this case, if the maximum current flowing in a half cycle is I (amperes) and the cross-sectional area of discharge space 15 of the light emitting tube is S ($cm^2$), the current density is controlled so that it is in the range of $1.5 \leq I/S$ (amperes/$cm^2$) $\leq 6.0$. The current density in this embodiment is 3.3 (amperes/$cm^2$).

The action of the low-pressure mercury discharge lamp apparatus of such structure is described.

Since first and second cathodes 17 and 20 are connected to a.c. power supply 40 through heater transformers 51 and 52 if lamp 10 is connected to a.c. power supply 40 via lighting circuit device 30, these cathodes 17 and 20 heat and emit thermoelectrons.

And, if a start-up voltage is overlapped on full-wave rectification diode bridge circuit 81 from start-up voltage overlapping circuit 84 of start-up circuit 80, the start-up voltage in the order of 600 volts for instance is supplied to lamp 10, whereupon lamp 10 starts to discharge.

The discharge of lamp 10 is maintained by rectifying the a.c. voltage of power supply 40 to a d.c. component by the use of rectifying and smoothing circuit 60, keeping the rectified voltage constant by means of output control circuit 70, and converting it to a rectangular voltage of a predetermined frequency by switching circuit 90 and applying it to lamp 10.

That is, a discharge voltage the porality of which reverses for each half cycle is applied to lamp 10, whereby the rectangular cycle current Ia as shown in FIG. 3 is supplied, and in one half cycle, the rectangular current flows from first cathode 17 to second anode 20 through discharge space 15, while in the next half cycle, the rectangular current flows from second cathode 19 to first anode 18 through discharge space 15. Hereafter, the current alternately flows in this way, whereby a discharge occurs between these electrodes. Thus, the discharge is alternately repeated between first cathode 17 and second anode 20, and first anode 18 and second cathode 19 for each reversal of the porality, thereby continuing the lighting.

By such discharge, the mercury vapor in discharge space 15 is ionized and excited in a low pressure state, and the electrons of ionized mercury atoms collide with each other to emit light in the shortwave ultraviolet region including resonance lines of 185 nm and 254 nm of mercury. The shortwave ultraviolet light is emitted from discharge tube 11 to the outside.

In such apparatus for irradiating an ultraviolet light, since the current waveform is made to be a rectangular waveform the peak value of which takes a flat shape as shown in FIG. 3, the lamp current can be made high as compared with the conventional method of supplying a sine wave to light the lamp, whereby the intensity of the ultraviolet light can be increased.

Although the reason for that is not clear, the following reasons can be thought of.

That is, if the rectangular current Ia having a flat peak is supplied to discharge path 15 of lamp 10, no low-current region occurs when the plus and minus polarities reverse, which low-current region occurs for the conventional sine wave, and accordingly, there is no reduction in the ionized mercury density, excited mercury density. Namely, there are no bad factors which hinders the ultraviolet output for the input, it is considered that almost all the energy supplied to the lamp is effectively converted to the ultraviolet output.

In addition, if the current waveform is made to be a rectangular waveform the pink value of which is flat, the current region of about √2 times the effective value can be cut as for the sine wave whereby the useless ionization of mercury atoms vaporized in the arc can be suppressed and an amount of excited mercury atoms can be secured. Further, the electron temperature can be maintained at a high level.

From these reasons, it is estimated that the increase of the optical output is enabled by increasing the current density as compared with before.

These effects at high current discharge have more influence than that of ordinal mercury discharge such as a fluorescant lamp.

As a result, by increasing the maximum value of the rectangular current Ia having a flat peak to a level at which the excitation of mercury atoms reaches a saturated state, the increase of the optical output corresponding to the current value is possible.

The above stated effect was confirmed through experiments performed by the present inventors. These experiments are described below.

FIG. 4 is a characteristics diagram showing the result of the examination by the present inventors on the relationship of the current density (amperes/cm$^2$) with the ultraviolet radiation strength at a wave-length of 254 nm for a discharge lamp, the rated input of which is 500 W.

In the same figure, the characteristic A is for the lamp when the conventional lighting circuit apparatus provided with a reactor element is used, and a sine wave current is supplied.

Further, in the same figure, B, C and D are the characteristics for the lamps when a rectangular current in supplied using lighting circuit apparatus 30 shown in the above embodiment. Incidentally, for the lamp of the characteristic B, the frequency was changed to 1 Hz, 10 Hz, 100 Hz and 1 kHz, respectively, and for the lamp of the characteristic C, the frequency was 10 kHz, and for the lamp of the characteristic D the frequency was 0.1 Hz.

As seen from the characteristics diagram, in the conventional method of supplying a sine wave current to the lamp, the ultraviolet radiation strength exceeds the peak before the current density reaches 1.5 (amperes/cm$^2$), and accordingly a further increase of the current density produces no increase of the ultraviolet radiation strength.

The lamps of the characteristics B, C and D are supplied with a rectangular current. It is confirmed that the ultraviolet radiation strength increases as the current density increases to 1.5 (amperes/cm$^2$) or greater.

Consequently, it is found that the ultraviolet irradiation strength can be increased by increasing the current density if a rectangular current is supplied to the lamp.

Incidentally, from the above experiment, it is confirmed that a good result can be obtained if the current density I/S is 1.5 to 6.0 (amperes/cm$^2$).

That is, if I/S is lower than 1.5 (amperes/cm$^2$), there is no difference from the ultraviolet radiation strength of the conventional low-output type lamp, and if I/S exceeds 6.0 (amperes/cm$^2$), the ultraviolet radiation strength reaches the peak, causing a saturated state, and the current is wasted and the ultraviolet irradiation efficiency is reduced if the current density is further increased.

For this, if the current density is increased to enhance the ultraviolet output, it is effective in the range of 1.5 ≦ I/S (amperes/cm$^2$) ≦ 6.0, where I (amperes) is the maximum current flowing during a half cycle and S (cm$^2$) is the cross-sectional area of the discharge path of the discharge tube.

In addition, from the results of the characteristics B, C and D, it is found that the ultraviolet strength is not affected by the frequency.

Further, it was confirmed that, for a lamp having other rated input, the desired object can also be accomplished by setting a similar current density.

Moreover, in the above embodiment, first cathode 17 and first anode 18 are provided at first end 12 of light emitting tube 11, and second cathode 19 and second anode 20 are provided at second end 13 of discharge tube 11, and a discharge is alternately be performed between first cathode 17 at one side and second anode 20 at the other end and between second cathode 19 at the other end and first anode 18 at the one end. Thus, the cathodes and anodes can be provided, separately and cathode 17 and 19 can be made small-sized to facilitate the emission of thermoelectrons with less heating power. Conversely anodes 18 and 20 can be made large-sized to increase the heat dissipation, thereby reducing the loss of the electrodes. This provides an advantage that the electrode efficiency increases, the design of the electrodes is facilitated, and the degree of freedom increases.

In addition, in first end 12 and second end 13, anodes 18 and 20 are disposed so as to project to the discharge space 15 side beyond cathodes 17 and 19, respectively, and each anode coil is shaped in a coil. Thus, electrons emitted from a cathode are sputtered from the front opening of the coil-shaped anode positioned before the cathode toward the anode at the other end, whereby the electrons are prevented from impinging on the valve wall. This prevents mercury ions from being attracted to the tube wall, and accordingly early blackening of the tube wall and reduction of mechanical strength are prevented.

Also, by surrounding the cathode with the coil-shaped anode, the cathode material and the emitter held by the cathode are prevented from depositing on the tube wall by the coil-shaped anode surrounding them when they scatter, and in the respect, the blackening of the tube wall is also prevented.

The discharge lamp is compact because it is bent in the shape of "U", and the space for receiving the lamp can be made small in spite of the sufficiently long discharge length. Furthermore, the apparatus for housing the lamp can be made small-sized.

In addition, for the lamp of the above embodiment, the gas pressure of the rare gas (such as argon gas) sealed along with the mercury is 0.05 to 0.8 Torrs, and this is fairly low as compared with the conventional fluorescent lamp.

The reason is because a lowering in the electron temperature is suppressed even when the lamp is lit. at a large current level and because, by doing so, the lamp voltage is made as high as possible so that the lamp input can be made as high at possible as the same current level. Although a lighting failure is liable to occurs by lowering the gas pressure, it can be suppressed by quickening the rise in the rectangular wave or raising the inverter's input voltage.

In addition, if the gas pressure is lower than 0.05 Torrs, the sputtering of the electrodes becomes extreme, and the blackening of the tube wall occurs to decrease the its life, and if the gas pressure exceeds 0.8

Torrs, the lowering in the electron temperature becomes prominent, thereby reducing the light emission efficiency.

FIG. 5 shows the second embodiment of the present invention, in which a low-pressure mercury discharge lamp is shown.

The low-pressure mercury discharge lamp of FIG. 5 is different from the first embodiment in that discharge tube 120 is shaped in a straight tube, and one hot cathode 124, 125 is disposed at both ends 121 and 122, respectively.

FIG. 6 shows the other current waveform of the present invention, and the present invention may use a trapezoidal current waveform Ib in addition to the rectangular current Ia shown in FIG. 3.

Also, the light emitting tube may be shaped in a bent shape such as "W".

As described above, in accordance with the present invention, the waveform of the current to be supplied to the lamp is that having a flat peak, and thus the amount of light emission can be increased by increasing the supplied current.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A low pressure discharge lamp apparatus comprising:

a low pressure discharge lamp having a discharge tube with a mercury/rare gas sealed therein, the discharge tube having a first and second end, the first and second ends each having electrodes, the electrodes defining a discharge space;

a lighting circuit means for lighting the low pressure discharge lamp by supplying a current with a polarity reversed for each half cycle to the electrodes of the first and second ends, the current having a waveform with a flat peak and a maximum current value of the current waveform is restricted to less than a level in which the excitation of mercury atoms is saturated, and wherein a relation given below is established $$1.5 \leq I/S \leq 6.0 \text{ (ampere/cm}^2\text{)}$$

where

I (ampere): a maximum value of the current whose peak is flat; and

S (cm$_2$): the cross-sectional area of the discharge space.

2. The low pressure discharge lamp apparatus according to claim 1, wherein a first cathode and first anode are provided at the first end, a second cathode and second anode are provided at the second end, a discharge occurs across the first cathode and the second anode at one half cycle of the current and a subsequent discharge occurs between the second cathode and the first anode at the next half cycle.

3. The low pressure discharge lamp apparatus according to claim 3, wherein the first anode projects further toward the discharge space than the first cathode and the second anode projects further toward the discharge space than the second cathode.

4. The low pressure discharge lamp apparatus according to claim 2, wherein the shape of the discharge tube is bent.

5. The low pressure discharge lamp apparatus according to claim 1, wherein the pressure of the sealed mercury/rare gas is 0.05 to 0.8 Torr.

6. The low pressure discharge lamp according to claim 1, wherein the current waveform is a rectangular wave.

7. The low pressure discharge lamp according to claim 1, wherein the current waveform is a trapezoidal wave.

* * * * *